(12) United States Patent
Lagowski et al.

(10) Patent No.: US 7,202,691 B2
(45) Date of Patent: Apr. 10, 2007

(54) NON-CONTACT METHOD FOR ACQUIRING CHARGE-VOLTAGE DATA ON MINIATURE TEST AREAS OF SEMICONDUCTOR PRODUCT WAFERS

(75) Inventors: Jacek Lagowski, Tampa, FL (US); Piotr Edelman, Tampa, FL (US); Dmitriy Marinskiy, Tampa, FL (US); Joseph Nicholas Kochey, St. Petersburg, FL (US); Carlos Almeida, Tampa, FL (US)

(73) Assignee: Semiconductor Diagnostics, Inc., Tampa, FL (US)

( * ) Notice: Subject to any disclaimer, the term of this patent is extended or adjusted under 35 U.S.C. 154(b) by 0 days.

(21) Appl. No.: 11/191,093

(22) Filed: Jul. 27, 2005

(65) Prior Publication Data

US 2006/0267622 A1 Nov. 30, 2006

Related U.S. Application Data

(60) Provisional application No. 60/686,134, filed on May 31, 2005.

(51) Int. Cl.
*G01R 31/26* (2006.01)
(52) U.S. Cl. .................................. 324/765
(58) Field of Classification Search ............... 324/750
See application file for complete search history.

(56) References Cited

U.S. PATENT DOCUMENTS

| | | | |
|---|---|---|---|
| 4,812,756 A * | 3/1989 | Curtis et al. ............... 324/750 |
| 5,498,974 A * | 3/1996 | Verkuil et al. ............... 324/767 |
| 5,594,247 A | 1/1997 | Verkuil et al. |
| 5,644,223 A | 7/1997 | Verkuil |
| 5,644,245 A * | 7/1997 | Saitoh et al. ............... 324/754 |
| 6,001,299 A * | 12/1999 | Kawabe et al. ............. 264/436 |
| 6,037,797 A | 3/2000 | Lagowski et al. |
| 6,097,196 A | 8/2000 | Verkuil et al. |
| 6,202,029 B1 | 3/2001 | Verkuil et al. |

(Continued)

OTHER PUBLICATIONS

Verkuil, "Contactless Alternatives to MOS Charge Measurements", Electrochem. Soc. Abst., #525, pp. 1312-1315, (no date).

(Continued)

*Primary Examiner*—Vinh Nguyen
*Assistant Examiner*—Richard Isla-Rodas
(74) *Attorney, Agent, or Firm*—Fish & Richardson P.C.

(57) ABSTRACT

A non-contact method is described for acquiring the accurate charge-voltage data on miniature test sites of semiconductor wafer wherein the test sites are smaller than 100 μm times 100 μm. The method includes recognizing the designated test site, properly aligning it, depositing a prescribed dose of ionic charge on the surface of the test site, and precise measuring of the resulting voltage change on the surface of the test site. The method further compromises measuring of the said voltage change in the dark and/or under strong illumination without interference from the laser beam employed in the Kelvin Force probe measurement of the voltage. The method enables acquiring of charge-voltage data without contacting the measured surface of the wafer and without contaminating the wafer. Thus, the measured wafer can be returned to IC fabrication line for further processing.

18 Claims, 9 Drawing Sheets

U.S. PATENT DOCUMENTS

| | | | |
|---|---|---|---|
| 6,538,462 B1* | 3/2003 | Lagowski et al. | 324/765 |
| 6,597,193 B2* | 7/2003 | Lagowski et al. | 324/765 |
| 6,680,621 B2* | 1/2004 | Savtchouk et al. | 324/765 |
| 6,937,050 B1* | 8/2005 | Fung et al. | 324/765 |
| 7,075,318 B1* | 7/2006 | Zhang et al. | 324/750 |
| 2004/0046585 A1* | 3/2004 | Kamieniecki et al. | 324/765 |

OTHER PUBLICATIONS

Piotr Edelman, et al., Non-Contact C-V Technique for High-K Applications, 2003, pp. 160-165.

Piotr, Edelman, et al., Full Wafer Non-Contact Mapping of Electrical Properties of Ultra-Thin Advanced Dielectrics on Si, 2002, pp. 211-215.

D.K. Schroder, et al., Corona-Oxide-Semiconductor Device Characterization, 1998, pp. 505-512.

Dieter K. Schroder, Contactless Surface Charge Semiconductor Characterization, 2002, pp. 196-210.

D. Marinskiy, P. Edelman, et al., Self-Calibrating Approach for Non-Contact Electrical Doping Profiling, 2005, pp. 249-253.

* cited by examiner

NON-CONTACT METHOD FOR ACQUIRING CHARGE-VOLTAGE DATA ON MINIATURE TEST AREAS OF SEMICONDUCTOR PRODUCT WAFERS

CROSS-RELATED APPLICATION

Under 35 U.S.C. 119(e)(1), this application claims the benefit of provisional application serial number, 60/686,134, filed May 31, 2005.

TECHNICAL FIELD

This invention relates to semiconductor wafer testing, and more particularly to non-contact measurement of charge-voltage data.

BACKGROUND

Semiconductor devices often contain dielectric layers (e.g., a layer composed of silicon dioxide) grown or deposited on a semiconductor substrate (e.g., a silicon substrate). Semiconductor wafers, including dielectric layers, are used in manufacturing integrated circuits (IC's) serving as microprocessors, memories, etc. Modern IC's incorporate very large numbers (currently exceeding $10^9$ elements per chip) of microelectronic devices such as metal-oxide-semiconductor (MOS) capacitors and MOS-field effect transistors (MOSFET). Their functioning depends on properties of dielectric layers. In IC fabrication, there is a need to precisely monitor the properties of dielectrics after dielectric growth or deposition and after other processing steps. Any deviation of dielectric properties from very strict specification can alter the performance of microelectronic devices and the manufacturing yield of integrated circuits. The key dielectric properties are dielectric capacitance and the corresponding electrical thickness, electrical leakage current across a dielectric, and electric charge in a dielectric layer and at an interface between the semiconductor and dielectric.

Non-contact charge-voltage metrology is an exemplary technique for monitoring all these properties of dielectrics disposed on a semiconductor wafer. Charge-voltage metrology includes depositing an ionic charge on the surface of a dielectric by means of corona discharge. Ionic charge induces a voltage drop across a dielectric and across the surface region of a semiconductor. By measuring these voltages with a vibrating capacitor method a charge-voltage data is obtained i.e. the Q-V data and the voltage time decay after charging.

Once the charge-voltage data is acquired, the parameters of a dielectric can be determined. For example, the dielectric capacitance $C_D$ is determined from $\Delta Q/\Delta V$ measured in appropriate surface charge range. The dielectric leakage current is determined form the voltage time decay rate $\Delta V/\Delta t$ as discussed by Lagowski et al. in U.S. Pat. No. 6,597,193, which is herein incorporated by reference.

The interface trapped charge, $Q_{it}$, is determined from a difference between the deposited corona charge $Q_c$ and the charge $Q_s$ mirrored in the semiconductor $Q_{it}=|Q_c-Q_s|$, where $Q_s$ is calculated for the semiconductor surface barrier $V_{SB}$ measured as a difference between $V_{CPD}$ in the dark and under strong illumination $V_{SB}=V_{CPD}{}^{DARK}-V_{CPD}{}^{LIGHT}$. The flatband voltage, $V_{FB}$, i.e. the very important parameter that characterizes the interface charge is determined from the value of $V_{CPD}$ when $V_{SB}=0$. Respective procedures for determining all above parameters are described in details by Lagowski et al. in U.S. Pat. No. 6,037,797, which is herein incorporated by reference.

Since its introduction in the mid 1990's [See corresponding review article "Contactless Surface Charge Semiconductor Characterization" by D. Schroder, Mat. Sci. Engineering B91–92 pp. 196–210 (2002) and article by Edelman et al., "Non-contact C-V Technique for High-k Applications" AIP Conf. Proc. 683. pp 160–165 (2003)], the corona-voltage metrology has been very successful in replacing conventional MOS capacitance-voltage, C-V, technique for characterization of dielectrics on semiconductor substrates. The MOS C-V requires fabrication of the test MOS capacitors that is done on special "monitor wafers" added to the production wafers for the purpose of monitoring dielectric growth or deposition process. Fabrication of capacitors is done after termination of growth or deposition. It adds to testing expenses and produces a delay between termination of dielectric growth or deposition and the availability of testing data. In the case of process failure, a time delay that often extends to many hours or even days can cause a loss of many production wafers processed during the time delay. The corona charge-voltage metrology can reduce this time delay to a wafer transfer and measuring total time of less than 0.5 h. Reduction of delay time and elimination of capacitor fabrication are evident advantages. However, this metrology still requires the use of monitor wafers.

Monitor wafers occupy space in a production line that could be occupied by production wafers. Furthermore, as semiconductor wafers continue to increase in size and become more expensive, using monitor wafers in a fabrication process becomes prohibitively expensive.

The preferable trend is to abolish monitor wafers and to perform monitoring on small 100 μm×100 μm or smaller test sites of product wafers. The product wafer is the actual production wafer that passes through all sequential stages of IC manufacturing process.

Non-contact electrical monitoring has not been done on the test sites because of the lack of suitable metrology. The existing technology can measure sites typically 2 mm to 10 mm in diameter, i.e., the areas 1000 times larger than the area of miniature test sites on product wafers.

The application of charge-voltage data is not limited to monitoring of dielectrics. Charge-voltage data can also be used for deriving important parameters of semiconductor substrates of product wafers. For example, a value of the generation lifetime can be determined by measuring the voltage time decay, after charging (e.g., measured with a semiconductor charged to deep depletion). This is a useful parameter and a sensitive measure of defects in semiconductors. A detailed discussion can be found in "Contactless Surface Charge Semiconductor Characterization" by D. Schroder, Mat. Sci. Engineering B91–92 pp. 196–210 (2002). The voltage decay after charging can be used for deriving the breakdown voltage of semiconductor and the semiconductor dopant concentration. See discussion in Marinsky et al., "Non-Contact Electrical Doping Profiling" by Marinskiy et. al., Characterization and Metrology for ULSI Technology; 2003 Int. Conf. AIP Conf. Proc. 683, pp. 802–806 (2003).

SUMMARY

The present invention provides a method for non-contact electrical monitoring on miniature test sites of a semiconductor wafer. These areas are smaller than 100 μm times 100 μm i.e. over 1000 times smaller than areas monitored by existing non-contact electrical methods. The monitoring on small area is achieved without sacrificing the precision. In addition, the monitoring according to the present invention is realized without contacting the wafer-measured surface and without contaminating the wafer. The method is therefore applicable to monitoring the product wafers that have to be returned to integrated circuit fabrication line after testing. The existing non-contact electrical monitoring methods are not suitable for miniature test sites on product wafers.

In one aspect, the invention features a non-contact method for acquiring charge-voltage data on a miniature test site of a semiconductor product wafer. The method includes locating the test site on the wafer, aligning a voltage measuring probe with the test site, positioning the probe at the working distance to the wafer surface, measuring the surface voltage on the test site, positioning the test area under the corona charging gun, depositing with the corona discharge a dose of ionic charge on the surface of the test site, positioning the test site under the voltage probe at the working distance and measuring the surface voltage after charging.

In another aspect of the invention, the voltage measurement prior to corona charging is omitted and the voltage measurement is done only after charging.

Still in another aspect of the invention, the voltage after charging is measured for a prescribed time interval producing corresponding voltage time decay data. The voltage measurements according to the present invention are done using the voltage micro-probe suitable for miniature sites i.e. the Kelvin Force probe with a laser beam employed for detection of the vibration of the cantilever. A conducting tip with a flat end is attached to the cantilever for measuring of the contact potential difference, $V_{CPD}$, between tip and the semiconductor wafer. The laser wavelength is specifically selected to avoid changing of the measured voltage, $V_{CPD}$, by the photovoltage induced in a semiconductor substrate by the stray laser beam light. According to the invention, measuring the voltage can include measurement in the dark and/or the measurement under illumination. This illumination generates electron-hole pairs in the semiconductor wafer and flattens a surface barrier of the semiconductor wafer.

In another aspect of the invention, depositing the dose of ionic charge is done by corona discharge. The method can also include calibrating the dose of ionic charge using a corona calibrating plate and the calibrating wafer or the sample. Applying corona discharge can include selecting the dose to be in a range from about $1 \times 10^{10}$ q/cm$^2$ to about $5 \times 10^{13}$ q/cm$^2$. The method further includes vacuum for flushing the corona gun after termination of each corona discharge and filling the gun with clean ambient to reduce contamination buildup within a gun and spreading the contaminants to the wafer surface.

To achieve voltage-measuring precision, not available with the standard commercial Kelvin Force microscopy, but necessary for IC process monitoring, the method provides a procedure for optimizing the cantilever and tip geometry. This optimization reduces the contribution from cantilever that senses an area larger than the test site and distorts measurement of $V_{CPD}$ between the small tip 5 µm to 10 µm in diameter and the wafer. Furthermore, the method optimizes the tip to wafer distance and by that it reduces tip-wafer interaction that alters $V_{CPD}$ value in conventional Kelvin Force microscopy.

The overall measuring method encompasses a machine vision system that recognizes the test sites on product wafer, identifies them, and determines their coordinates. Then a precision moving stage moves wafer to position the Kelvin Force probe tip and the corona-charging gun to prescribed location within the test site for measuring and charging, respectively.

After the charge-voltage data is acquired, the parameters of a dielectric layer disposed on the surface of the test site are determined using existing procedures developed for corona charge-voltage metrology on larger areas of monitor wafers. These parameters include, but are not limited to the dielectric layer capacitance, the dielectric leakage current, the interface trapped charge, and the flatband voltage.

The application of charge-voltage data acquired with present invention is not limited to monitoring of dielectrics. This data can also be used for deriving important parameters that characterize the semiconductor substrates of product wafers; i.e. the generation lifetime that measures contaminants introduced by processing; the breakdown voltage of semiconductor and the semiconductor dopant concentration. Some existing procedures for determining such parameters from measurement on monitor wafers may be applicable to charge-voltage data acquired on the miniature test sites of product wafers.

The present method enables charge-voltage monitoring to be done within areas even as small as 30 µm×30 µm and smaller. This opens the possibility for non-contact monitoring on product wafers of current and future IC generations with a premise of economic advantages due to elimination of monitor wafers.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 2b shows a cantilever with a tip for the Kelvin Force measurement setup in FIG. 3a.

DETAILED DESCRIPTION

The charge deposition can be done without contacting the wafers using corona discharge in air. Most often, the discharge is done in controlled humidity air, but can also be done in other ambients. Discharge is produced by a high DC-voltage (e.g., in kV range) applied to a needle electrode. Positive or negative DC-voltage produces positive or negative corona ions, respectively. These ions diffuse in the air and reach a desired area on the wafer surface by passing through an opening in a diaphragm separating the wafer and the needle electrode. For a semiconductor wafer with a dielectric layer disposed on it, the corona ions induce the voltage across dielectric and semiconductor surface region. This voltage can be measured in a non-contact manner using a vibrating capacitor technique, such as the vibrating Kelvin probe method that measures the contact potential difference ($V_{CPD}$) between the probe and the semiconductor wafer. In preferred embodiments, charge-voltage data is obtained from probing areas that are within the test sites. For present IC technology, the test sites are approximately 50 μm×70 μm, on semiconductor product wafers and probing areas defined by the size of a voltage probe are smaller than that. The product wafer is the actual production wafer that passes through all sequential stages of IC manufacturing process. In some embodiments, the test sites are rectangular or square. Test sites located within scribe lines are referred to as test boxes and they do not take away the wafer space reserved for IC components. Other test sites on product wafers may be contained within dies. The $V_{CPD}$ within small test sites can be measured with a version of Kelvin method, e.g., a Kelvin Force method, in which the probe vibration is monitored using a reflection of the laser beam directed on a position sensitive detector (PSD). The PSD generates a signal proportional to the amplitude of the probe deflection. The $V_{CPD}$ is determined based on the PSD signal vs. the DC bias applied to the probe.

The overall measuring method encompasses a machine vision system that recognizes the test sites on product wafer, identifies them, and determines their coordinates. A precision moving stage positions the test site under the Kelvin Force probe and the corona-charging gun, for measuring and charging, respectively. Positioning the test site under the Kelvin Force probe or under the corona-charging gun is equivalent to positioning the Kelvin Force probe or the corona-charging gun over the test site.

Figure 1:
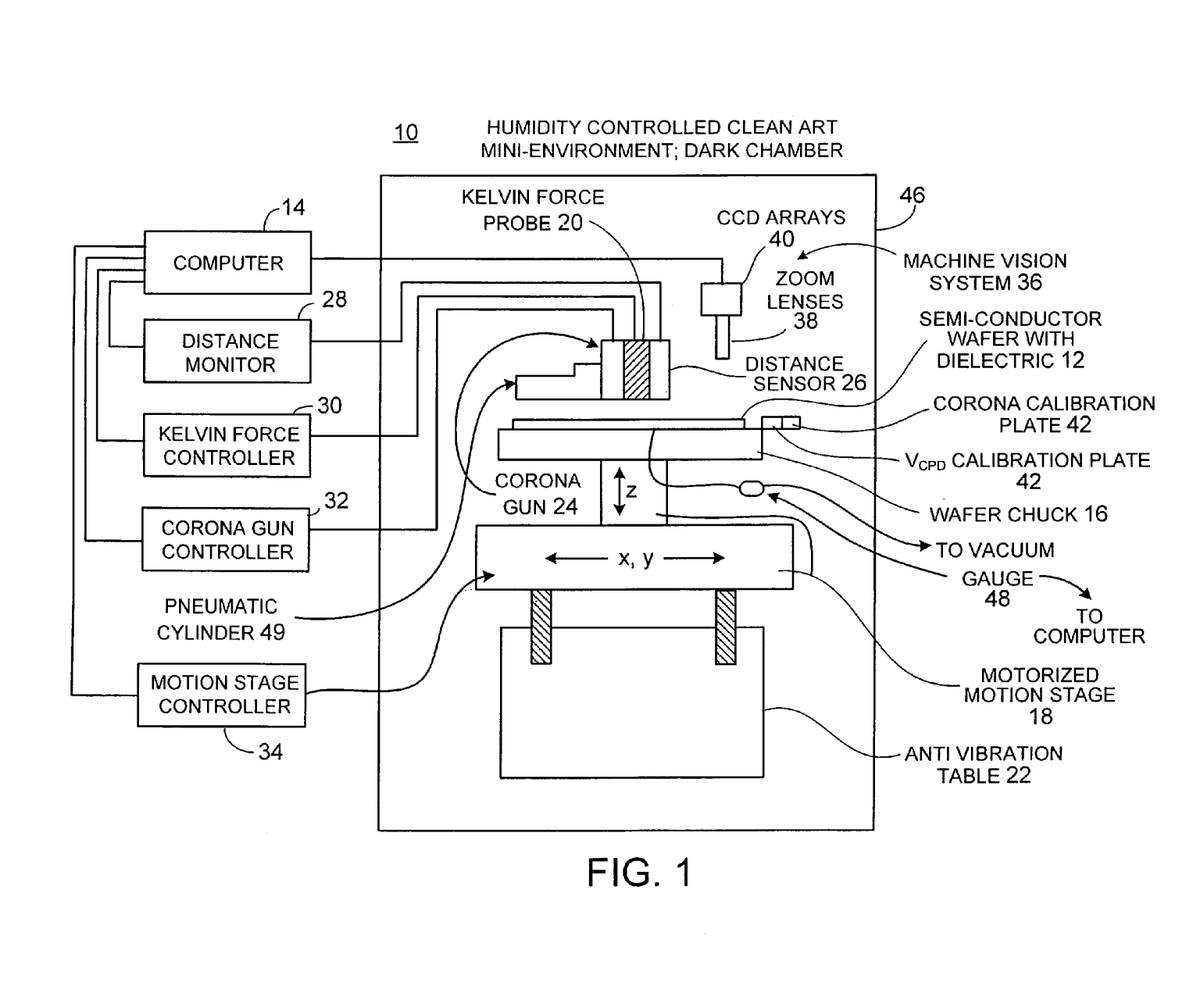
FIG. 1 shows an exemplary test system for acquiring charge-voltage data on a miniature test site of a semiconductor product wafer.

Referring to FIG. 1, a computer controlled test system 10 of the preferred embodiment is shown. The system is for acquiring charge-voltage data on miniature test sites of a semiconductor wafer 12. The test system 10 includes a computer 14 that controls components of the system and performs calculations of various parameters from the acquired charge-voltage data. The system 10 includes a wafer chuck 16 that holds the wafer 12 either by a vacuum or by the edge grip. The wafer chuck 16 is mounted on a high precision motorized x, y, z (or x, θ, z) stage 18. In a preferred embodiment, the x, y motion of the stage 18 is precise to within ±1 μm. The z-motion controls distance between the Kelvin Force probe 20 and the wafer 12. During measurement, the flat end of the probe tip 60 (FIG. 2) is parallel to the wafer surface and typically about 1 μm from it. Therefore, the high precision stage 18 is able to move very precisely in the z-direction in increments as small as about 0.01 μm. The stage 18 with the wafer chuck 16 is mounted on an anti-vibration bench 22 that isolates the wafer 12 and the Kelvin Force probe 20 from the external vibration sources. Isolation is useful due to the small probe-tip wafer distance and the small amplitude of tip vibration that is at maximum of about 0.1 μm. The isolation reduces disturbances of the tip by vibration noise.

As shown in FIG. 1, the Kelvin Force probe 20, the corona gun 24, and the distance sensor 26 are contained within one assembly positioned above the wafer 12. The corona gun 24, the distance sensor 26, the Kelvin Force probe 20, and the stage 18 are all connected to the computer 14 via the corona gun controller 32, the distance monitor 28, the Kelvin Force controller 30, and the stage motion controller 34, respectively.

The system 10 includes a machine vision system 36 with zoom lenses 38 positioned above the wafer 20 and coupled with CCD arrays 40. Using a digital camera, the machine vision system 36 enables viewing details on the wafer surface with a resolution of about 1 μm. The machine vision system 36 sends data to the computer 14, identifies the test sites on product wafers, and helps to position the Kelvin Force probe tip 60 approximately above the center of the probing area within the test site for voltage measurements and to position the corona gun aperture above approximately the same spot for charging with corona ions.

The test system 10 also includes two calibration plates, a corona calibration plate 42 and a $V_{CPD}$ calibration plate 44, mounted on a side of the wafer chuck 16 and leveled with the wafer surface. The $V_{CPD}$ calibration plate 44, made of a noble metal insert, serves as a contact potential reference for adjusting the $V_{CPD}$ value of the Kelvin Probe tip 60. The purpose is to correct the $V_{CPD}$ value of individual probes and to make the measurements exactly the same after exchange of the probes. The corona calibration plate 42 is connected to a calibrated capacitor and a voltmeter for the purpose of calibration and verification of the charging characteristics of the corona gun 24. For the calibration capacitor, $C_{CAL}$, the value of total corona charge ($\Delta Q$) in units of charge i.e., q or Coulombs; deposited on the plate can be precisely determined from the voltage change on the capacitor $\Delta V$ as $\Delta Q = C_{CAL} \cdot \Delta V$ where $\Delta Q$ refers to the charge while $\Delta Q_c$ refers to surface charge density (i.e., charge per unit area). The corona calibration plate 24 replaces the in-situ monitoring of corona charging that was done in previous "monitor wafer" metrology using a needle type backside electrical contact to the wafer. (The needle was then connected to Coulombmeter for reading the charge deposited on the wafer). For product wafers, it can be beneficial to eliminate the needle contact due to generation of micro-particulates that can interfere with subsequent IC-manufacturing.

Using the corona calibration plate 42 the quantitative characteristics of corona gun 24 are determined (e.g., a relationship of an ionic flux to surface to: corona discharge voltage, a discharge current, a diaphragm bias, a gun geometry, or the bias applied to wafer 12 during deposition). Wafer bias can attract or repeal corona ions increasing or decreasing ionic flux to the surface. Biasing the wafer employs electrical contact. This can be done without invasive needle-type contacts by gently touching the edge of a product wafer with a conductive plate. In the case of silicon wafer, such contact is a poor quality non-ohmic contact. However, it is sufficient for the purpose of biasing.

The ionic flux characteristics can be converted to corresponding $\Delta Q_c$ characteristics with help of additional calibrating measurements. Such measurements are performed on heavily doped silicon wafers or samples with dielectric film of known dielectric capacitance $C_D$ per cm². Corona charging induced change of the contact potential difference $V_{CPD}$ is measured with the Kelvin probe 20 and the charge density is determined as $\Delta Q_c = C_D \cdot \Delta V_{CPD}$. In preferred embodiment, highly doped silicon is used to assure that there is no contribution from semiconductor surface to the capacitance and to the $\Delta V_{CPD}$. The quantitative corona charging characteristics are introduced into computer software controlling the corona charging.

Figure 2A:
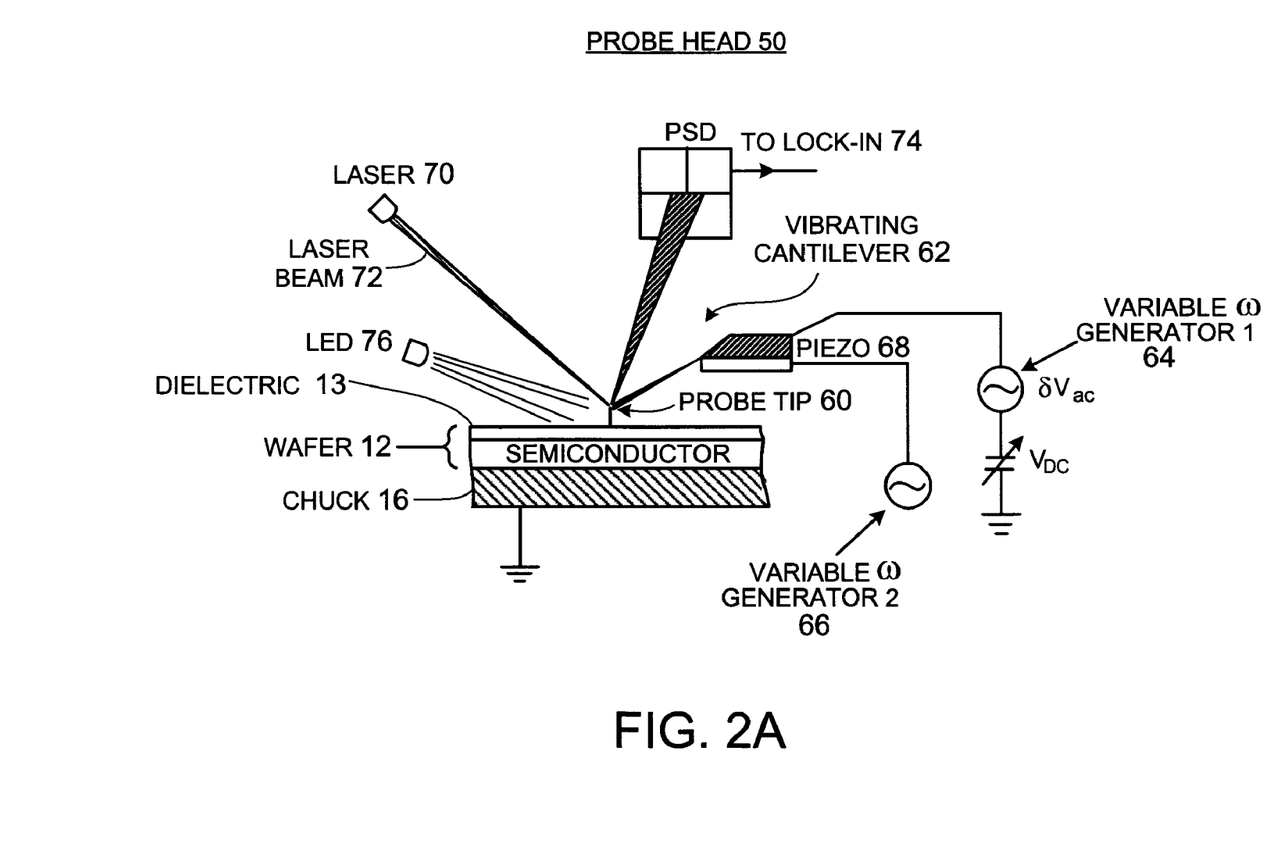
FIG. 2a shows a schematic of the Kelvin Force set-up for use with the test system in FIG. 1.
Figure 2B:
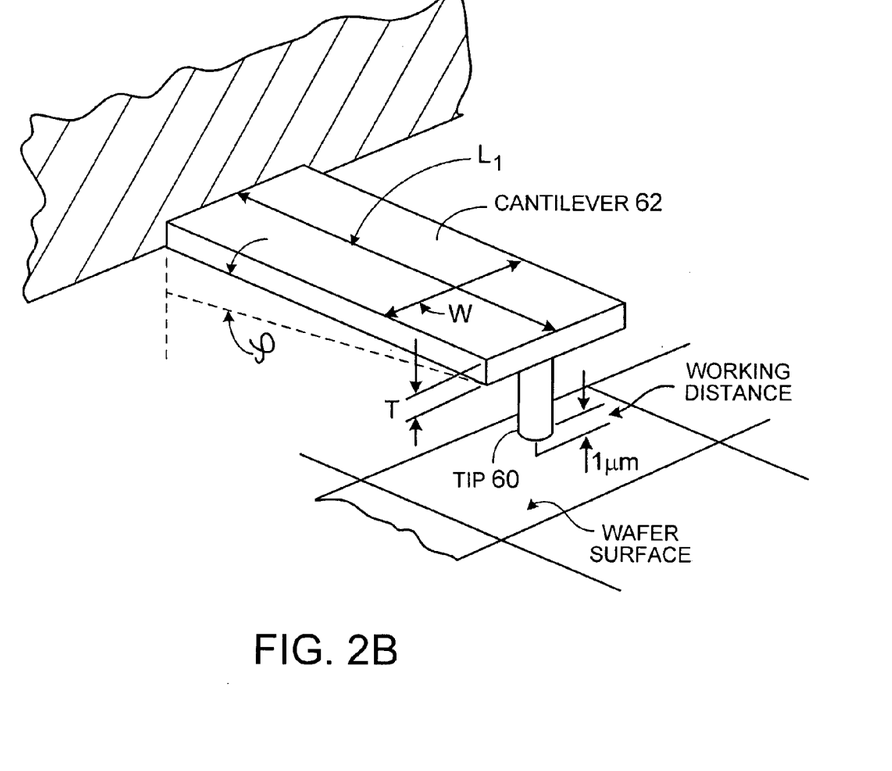

Referring to FIGS. 1, 2a and 2b, the Kelvin Force Probe 20 incorporates the Probe Head 50 that further incorporates the cantilever 62 with the tip 60, the piezo-element 68, the laser 70 emitting the laser beam 72, the laser beam position sensitive detector 74 and the light emitting diode 76. The generator 64 and generator 66 are located in the Kelvin Force Controller 30. A probe tip 60 attached to a cantilever 62 is positioned above the wafer surface. The vibration of cantilever 62 can be stimulated by a signal sent from a first generator 64 or by a signal sent from a second generator 66. The first generator 64 applies a small ac-voltage, $\delta V_{ac}$ to the probe tip 60 via the electrically conducting cantilever 62 and cantilever mounting base (not shown). The second generator 66 applies an ac-signal to the piezo-element 68.

A first method is used during actual measurement of the $V_{CPD}$. In a second method, a frequency scan is used for finding the resonance frequency, $\omega_R$, of the cantilever 62. The resonance vibration stimulated by the piezo-element 68 is also used in a procedure of the tip approach to the surface. In some embodiments, the cantilever 62 has a resonance frequency, $\omega_R$, of about 200 kHz.

The amplitude of tip vibration is detected by measuring a corresponding deflection of the cantilever 62. For that purpose a light beam 72 from the laser 70 is directed on the cantilever 62 and reflected on the position sensitive detector (PSD) 74. A vibration of the cantilever 62 causes a laser beam displacement on the PSD 74 that generates electrical signal proportional to this displacement. This signal is precisely measured with the lock-in amplifier (not shown) using phase-sensitive detection locked to the reference signal from the first generator 64 or the second generator 66 for $V_{CPD}$ measurement or for piezo-vibration, respectively. With this technique, amplitude of vibration can be readily detected with precision better than approximately 1 Å.

The Kelvin probe tip 60 is conducting and its flat ending senses the contact potential difference $V_{CPD}$ with respect to the wafer surface. The tip and the wafer form a capacitor. The force acting on this tip is proportional to the square of the voltage difference between the tip 60 and the wafer 12 and to the gradient of tip-wafer capacitance $\delta C/\delta z$. In Kelvin Force method (for a discussion see "High Resolution Atomic Force Microscopy Potentiometry" by Weaver and Abraham, J. Vac. Sci. Technology B9, pp 1559–1561 (1991)), the force acting on the tip is modulated by an ac-voltage, $\delta V_{ac}(t) = \delta V_{ac} \sin \omega t$, applied to the tip 60. For $\omega = \omega_R$; this modulated force generates resonant vibration of the cantilever 62.

To measure $V_{CPD}$ a dc-bias $V_{DC}$ is applied to the tip 60 in a feedback loop with a signal from lock-in representing the amplitude of vibration. The ac force component causing vibration is $F_{ac} = \delta C/\delta z \cdot (V_{DC} + V_{CPD}) \cdot \delta V_{ac} \cdot \sin \omega t$. By nulling the amplitude of vibration, $V_{CPD}$ is determined from corresponding bias value as $V_{CPD}$ equals $-V_{DC}$. For charge-voltage metrology of dielectrics on a semiconductor, it is useful to measure $V_{CPD}$ in the dark; $V_{CPD}^{DARK}$, and under strong illumination, $V_{CPD}^{LIGHT}$. The difference between values of $V_{CPD}$ measured in the dark and under illumination, $V_{SB} = V_{CPD}^{DARK} - V_{CPD}^{LIGHT}$, is used to identify the potential drop in the near surface region of the semiconductor, i.e. the semiconductor surface barrier $V_{SB}$. For the test system 10 in FIG. 1 the wafer 12 and Kelvin Force probe head are enclosed in the dark chamber 46.

To measure $V_{CPD}^{LIGHT}$, the area near the tip 60 is illuminated with a strong light from a light emitting diode (LED) 76 shown in FIG. 2a. The light from the LED 76 is intended to collapse the potential barrier near semiconductor surface causing $V_{SB}$ to be approximately equal to zero. This barrier collapsing is due to well-known surface photovoltaic effect caused by the excess carriers (electrons and holes) that are photo-generated in a semiconductor. Photo-generation of excess carriers takes place when the energy of photons hv is equal to or exceeds the energy gap $E_g$ of the given semiconductor hv$\geq E_g$. For silicon at room temperature $E_g$ is 1.12 eV and the condition for excess carrier generation is hv$\geq$1.12 eV. These conditions can be rewritten in terms of the LED light wavelength λ in micrometers as $\lambda_{LED} \leq 1.24/E_g$ that for silicon gives $\lambda_{LED} \leq 1.1$ µm. The test system on FIG. 1 incorporated green LED emitting light with λ=0.55 µm that is suitable for silicon wafer.

For precise measuring of $V_{CPD}^{DARK}$ and $V_{SB}$ with Kelvin Force probe in FIG. 2a a stray light from the laser 70 must not generate excess carriers that could alter the semiconductor surface barrier in the measured wafer. For testing Si wafers this condition is not satisfied in commercial Scanning Probe Microscopes, including the commercial Kelvin Force Microscopes, operating with visible lasers that are convenient for optical alignment. The visible light generates excess carriers in silicon and thus changes the $V_{CPD}$. Complete shielding of the stray laser light from reaching the wafer is difficult. In a preferred embodiment the laser is used with the laser wavelength in a spectral range whereby the laser light 72 does not generate excess carriers. Thus the laser wavelength $\lambda_{LASER}$ is sufficiently long, such that $\lambda_{LASER} > 1.24/E_g$. For silicon, $\lambda_{LASER} > 1.1$ µm. In some embodiments, the Kelvin Force system 50 monitors voltage on a silicon wafer and laser 70 is an InGaAsP laser emitting invisible light at a wavelength $\lambda_{LASER} = 1.31$ µm. (i.e. larger than 1.1 µm). In some experiments, it has been confirmed that this laser light does not cause any change of $V_{CPD}$ in silicon wafer, while stray light from the typical red laser (λ=0.68 µm) in standard Kelvin Force microscope can change $V_{CPD}$ by as much as 0.5V.

The operating wavelength of the laser 70 and the spectral range of PSD 74 overlap. Therefore, the Kelvin Force system 50 for monitoring charge-voltage data on silicon does not use a silicon PSD 74, which are used in commercial Scanning Probe Microscopes. In some embodiments, a suitable PSD overlapping 1.31 µm of the laser is provided by InGaAs PSD that operates for wavelength shorter than 1.401 µm i.e. overlapping with $\lambda_{LASER} = 1.31$ µm.

It shall be understood that other laser and PSD combinations can also be selected according to guiding rules given above. This may be useful for monitoring semiconductor wafers other than silicon. Similar consideration regarding the selection of light wavelength can be easily extended to semiconductor materials other than silicon. Referring to FIG. 2b, a cantilever 62 with a probe tip 60 is shown for use with the Kelvin Force setup 50 in FIG. 2a.

Figure 2C:
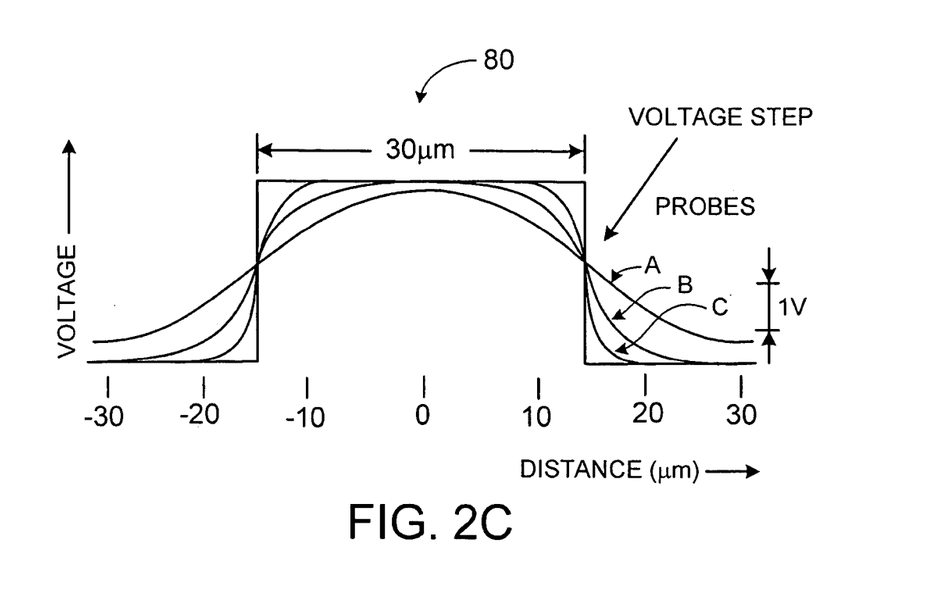
FIG. 2c demonstrates the spatial resolution of Kelvin Force measurement of the voltage with a probe in FIG. 2b.
Figure 2D:
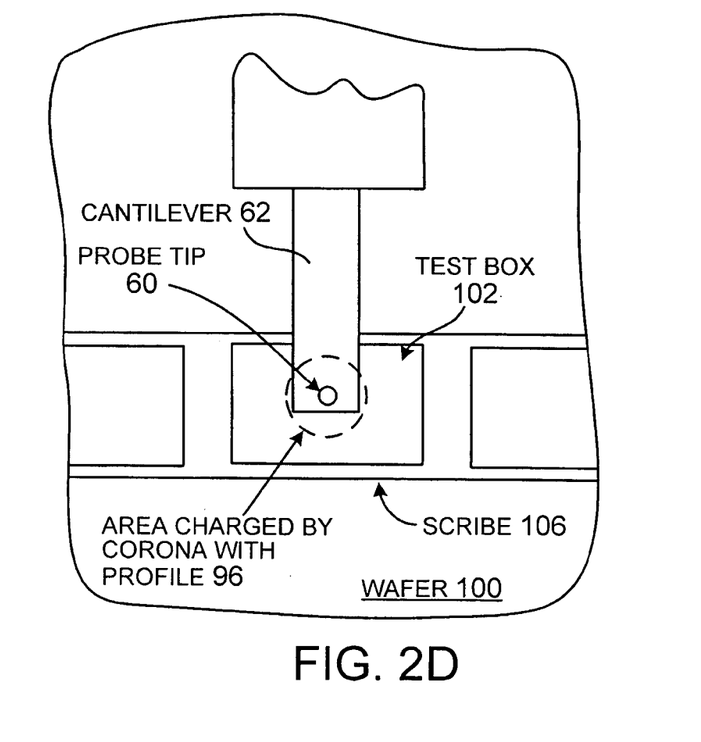
FIG. 2d is a top view of cantilever with the tip positioned above the test site that is the scribe-line test box on semiconductor wafer.

Referring to FIG. 2d, the Kelvin Force Probe cantilever 62 with the tip 60 positioned above the center of miniature test area 102 overlaps an area substantially larger than the area 96 charged by corona gun 24. For accurate detection of the voltage change caused by corona charging on small areas the geometry of cantilever and tip in Kelvin Force Microscopy has to be optimized to avoid pickup of the signal by the cantilever rather than the tip. The optimization of cantilever tip geometry can be done considering that the total capacitance of the system has two components, from the tip and from the cantilever, and that the force acting on the cantilever capacitor plate must be made much smaller than the force acting on the tip capacitor plate. The respective discussion can be found in "Cantilever effects on the measurement of electrostatic potentials by scanning Kelvin probe microscopy" by G. Koley et al., Appl. Phys. Lett., 79, 2001 (4) P. 545. Shortening the cantilever 62 and decreasing its width decreases relative contribution from the cantilever; while elongating the tip 60, increasing the tip flat ending area and decreasing tip distance to the wafer surface increase the relative contribution from the tip 60 to the total capacitance of the system. In some embodiments, the diameter of probe tip is about 5 to 10 μm. Such micro-probe is much larger than the typical Kelvin Force probes of nano-dimensions. For comparison, tips in commercial Kelvin Force Microscopes have sharp endings with radius of curvature of about 0.1 μm, i.e. 1000 nanometers. In exemplary embodiments, probe tip 60 shown in FIG. 2b has a height of about 15 μm and a diameter of about 10 μm. The cantilever 62 has a length of about 90 μm and a width of about 30 μm. For the geometry of FIG. 2b and tip-wafer working distance 1 μm the contribution from cantilever 62 is about three-percent of that from the probe tip 60.

In some embodiments an angle φ of about 20° between cantilever 62 and the wafer surface shown in FIG. 2b, is used to avoid a contact between the cantilever 62 and its base and the wafer surface.

The cantilever 62 and the tip 60 are made of highly doped single crystalline silicon. The tip 60 with geometry shown in FIG. 2b can be fabricated by either cutting the commercially available tips at an angle or by attaching a tip of appropriate shape to the tipless cantilever, and if necessary, cutting its end at an angle φ=20° to make it parallel to the wafer surface. The tips can be cut using Focused Ion Beam tools. After that, the tips and cantilevers are coated with a conductive noble metal film. Because of the poor adhesion to Si of noble metals, the optimal silicon coatings combine two layers, for example Au on Cr or Pt on Ti.

In some embodiments the Kelvin force probe 20 provides a spatial resolution with 90% voltage drop over less than 10 μm when scanned across a voltage step of about 3V. Increasing the area of the probe tip 60 produces a larger capacitance between probe tip 60 and the wafer 12. This increases the sensitivity of Kelvin force probe 20. The preferred embodiment arrangement gives $V_{CPD}$ accuracy of ±0.5 mV. This accuracy is needed for charge-voltage monitoring of advanced semiconductor product wafers. The upper limit of the tip diameter is provided by a width or a length (whichever smaller) of the test site. The lower limit of the tip diameter in charge-voltage metrology is brought about by a condition that it must be much larger (e.g., at least about 10 times larger) than the average distance between ions, $d_{ion}$, deposited on the surface in corona charging dose $\Delta Q_c$. Since $d_{ion}=1/\sqrt{\Delta Q_c}$, the dose $\Delta Q_c=1E10$ q/cm² places lower limit for tip diameter for $10/\sqrt{\Delta Q_c}=10^{-4}$ cm (e.g., 1 μm). The tip geometry in FIG. 2b satisfies this condition. Standard Force Microscopy tips have diameters from 1E-7 cm to 1E-5 cm. A tip of 1E-7 or 1E-6 cm in diameter may not have a single corona ion under it even for corona doses as large as 1E12 q/cm².

The working tip-wafer distance is limited on the upper end by the requirement of high measurement precision and a high spatial resolution. Both of them deteriorate with increasing distance. On the lower end the tip-wafer distance is limited by the need to minimize a probability of tip-wafer touching and of potential tip-wafer interaction. For very small tip-wafer distances, electric charge transfer can take place between tip and semiconductor due to workfunction difference and/or the bias applied to the tip during measurement. One may notice that scanning tunneling microscopy operates based on this effect.

Exemplary 1 μm working distance eliminates tip-wafer interaction and reduces the likelihood of accidentally touching probe tip to wafer which could physically damage the fragile tip and cantilever or contaminate wafer. A production wafer, if contaminated, would need to be discharged from further manufacturing.

Referring to FIG. 2c, a plot 80 illustrates that for longer tip-wafer distances the spatial resolution of Kelvin Force measurement deteriorates as shown by scans B and C performed with a tip at 3 μm and 6 μm from the wafer surface, respectively.

Figure 3:
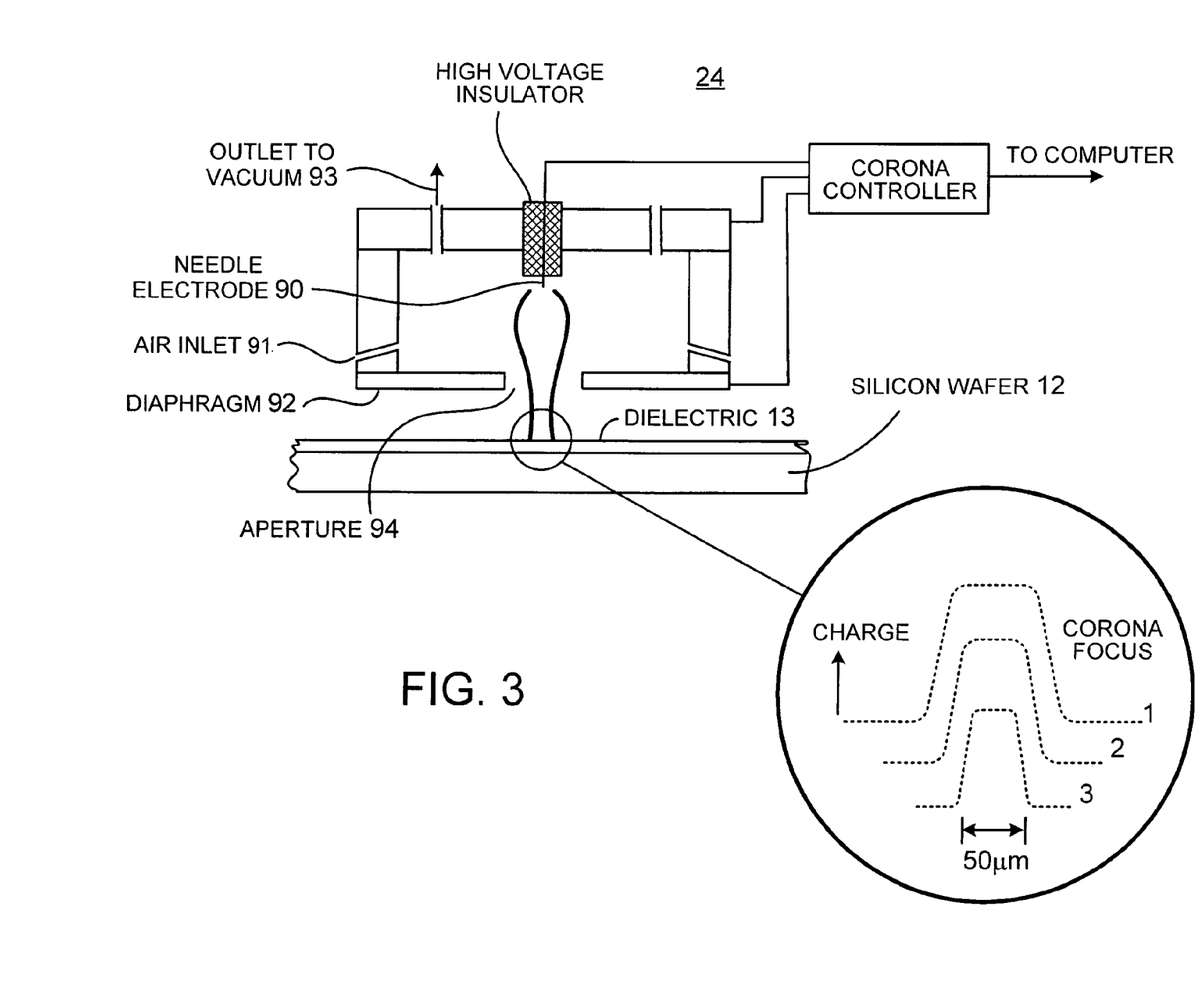
FIG. 3 is a schematic of the corona-charging gun for use with the test system in FIG. 1.

In reference to FIG. 3, the corona gun 24 in test system 10 in FIG. 1 contains a needle electrode 90 that can be about 75 μm in diameter and a diaphragm 92 with an aperture 94 that separates needle electrode 90 and the wafer 12. High DC-voltage 0.9–2 kV from the corona controller 32 is applied to needle electrode 90 producing a corona discharge in air. Ions created by a discharge diffuse away from the needle 90. A diffusing stream of ions is directed towards the aperture 94 by bias of the same polarity as the high DC-voltage, but applied to the diaphragm 92 and to the top electrode above the discharge needle. The diaphragm bias is used to focus the corona beam and shape the charging spot on the surface of dielectric 13. With a diaphragm aperture of 100 μm in diameter biased to 90V, the narrow charge distribution profile 3 in the insert in FIG. 3 can be obtained. The flat portion of this profile 96 is substantially larger than 5–10 μm diameter of the tip 60 of Kelvin Force probe 20 in exemplary case. For larger diaphragm apertures, the broader profiles 96 shown by the scan 2 and scan 1 are obtained. The corona charging flux can also be increased by biasing the wafer 12 with appropriate polarity that attracts corona ions.

Additional factors that shape distribution of corona charge on dielectric surface and charge deposition rate is the corona gun geometry. This geometry includes the needle to diaphragm distance, which can be, for example, between approximately 2 mm and 6 mm. The geometry also includes the diaphragm wafer distance that can be about 250 μm. The deposited charge can be also varied depending on duration of corona charging.

In the test system 10, shown in FIG. 1, the pre-calibrated corona charging characteristics stored in computer software can be used to preset the value of charge dose and to select charging condition suitable for a specific application. For example, small charging doses in the range of 1E10 q/cm² can be used for monitoring the capacitance of thick dielectric films with low dielectric constant, commonly know as low-k materials. Multi-charging and measuring steps with low to medium dose (1E10–1E12) q/cm² are used for determining the flatband voltage $V_{FB}$ and the interface trap density in advanced gate dielectrics. Medium to large dose charging (1E12–1E13 q/cm²) is used for monitoring capacitance and electrical thickness of thin gate dielectrics including high-k dielectrics such for example $HfO_2$ and $Al_2O_3$. Large dose exceeding 2E13 q/cm² is employed for monitoring dielectric leakage current in tunneling range.

Corona discharge is typically conducted in air. However, it can also be conducted in other gas ambient. The corona gun in FIG. 3 contains air inlet openings 91 and outlets 93 to a vacuum. They are intended to replace the ambient within corona gun confinement after each charging. This reduces chemical activities induced by corona-generated ozone; and prevents build up of contaminating deposits within the gun. These deposits could lead to particulates and contaminate the wafer. To avoid air flow interference with corona charging, vacuum flushing is done when corona charging is off. With vacuum flushing the added particulates can be reduced practically to zero even after many corona-charging cycles on the same test site.

Coordinates of the center of the Kelvin probe tip 60 and of the center of corona diaphragm aperture 94 with respect to the wafer chuck are introduced to the computer software and they are for precise positioning at the center of the measured area for voltage measuring and corona charging respectively.

Figure 4A:
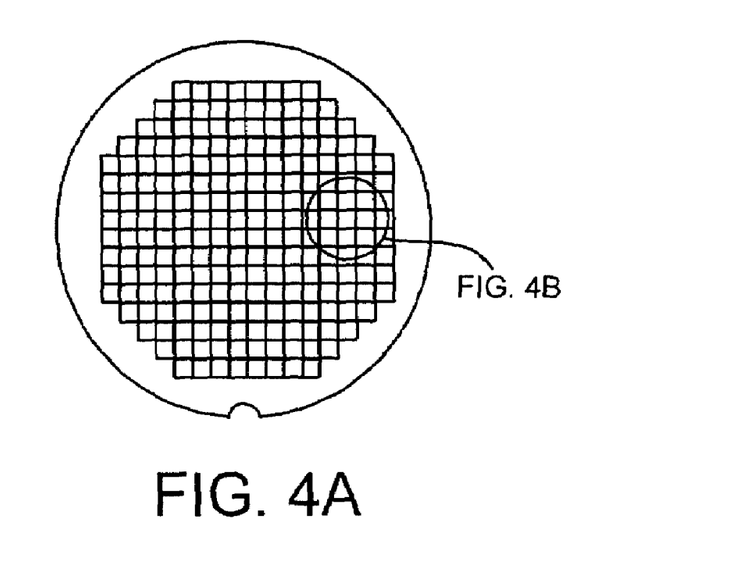
FIG. 4a is a schematic view of an exemplary product wafer with a small test site that is measured using the test system shown in FIG. 1
Figure 4B:
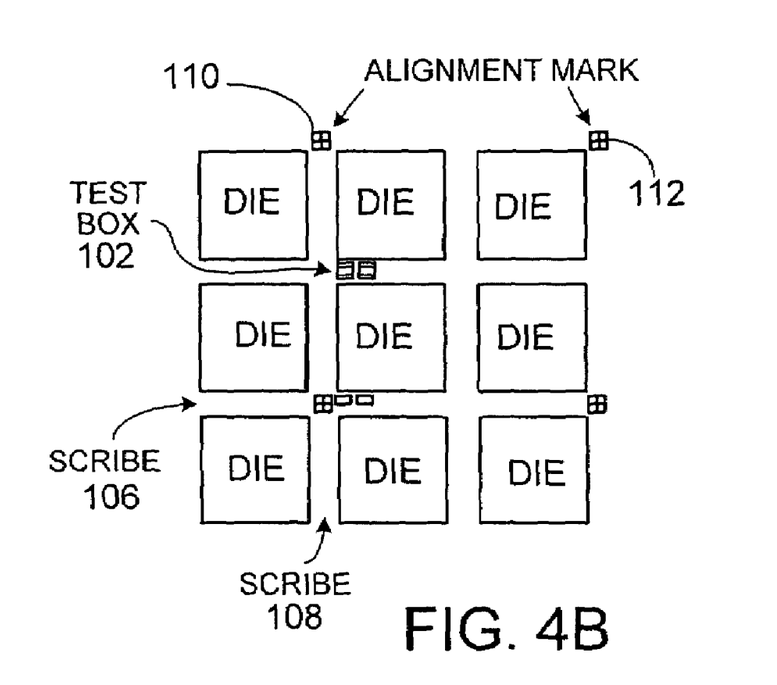
FIG. 4b is a magnification of the fragment of the wafer in FIG. 2a that shows the wafer region around the test site.

In reference to FIGS. 4a and 4b, an exemplary product wafer 100 is shown with small test sites (e.g., test box 102) to be measured with the test system in FIG. 1. The product silicon wafer 100 has a pattern of integrated circuit (IC) devices. Product wafer includes dies (e.g., die 104) and scribe lines (e.g., scribe lines 106 and 108). A die is an area containing a single IC. In some embodiments, die 104 is about 1 cm×1 cm or larger. Scribe lines separate the dies from one another. After manufacturing, the wafer 12 is cut along the scribe lines producing chips with integrated circuits. The width of scribe lines at present state of technology is less than about 100 μm. Within scribe lines there are alignment marks (e.g., alignment marks 110 and 112) used in wafer fabrication or test boxes used for quality control monitoring. They are shown in FIG. 4b that magnifies the fragment of wafer in FIG. 4a. In some embodiments a test site is a scribe line test box. The probing site is smaller than the test site and is located within it. In additional embodiments a test site is a small area within the dies. In further embodiments, a test site is less than approximately 100 μm×100 μm.

Coordinates of both types of test sites to be measured are specified prior to wafer measurement. These coordinates are inputted into the system computer. Machine vision system 36 finds alignment marks (e.g., alignment marks 110 and 112) on the wafer 12 and also refers them to the wafer chuck 16. The test boxes can then be located using these coordinates and can be positioned under the Kelvin probe tip 60 or under the corona aperture 94 by appropriate movement of motorized motion stage 18 shown in FIG. 1. Positioning the test boxes under the Kelvin probe tip 60 or under the corona aperture 94 is equivalent to positioning the Kelvin probe tip 60 or the corona aperture 94 over the test boxes.

Identification of the alignment marks can be achieved with the machine vision system 36 that incorporates pattern recognition software. Such a system includes a camera with a matching lens and a light source, a frame grabber computer board that translates the image into a digital form and the software capable of analyzing the captured image. An example of commercially available machine vision system is a Vision Pro by Cognex. The machine vision system 36 has sufficient resolution to resolve the features of interest on the wafer 12, like alignment marks, test boxes and alphanumerical marking of the boxes. In some embodiments, the resolution of the machine vision system 36 is about 1 μm and the field of view of about 15 mm×15 mm. The output of the machine vision system 36 is the set of coordinates of the recognized objects within the field of view.

Typically, a 200 mm or 300 mm diameter wafer is much larger than the field of view. Accordingly, the machine vision system 36 in the test system in FIG. 1 is combined with the high precision wafer motorized stage 18. An example of such commercial setup is a set of moving stages with a motion controller supplied by Newport Corporation.

The distance sensor 26 in FIG. 1 is placed in one assembly with the Kelvin force probe 20. In some embodiments, the distance sensor 26 is a capacitive sensor with a resolution of 5 μm and a working range up to 20 mm. (Such sensor is available from ADE Technologies).

During the wafer loading on the wafer chuck the tip-wafer distance is large, e.g. 5 mm. After that the approach procedure is used that brings the tip 60 to a small working distance of about 1 μm from the measured surface, the distance sensor 26 may be used at the initial stages of the approach.

Figure 5A:
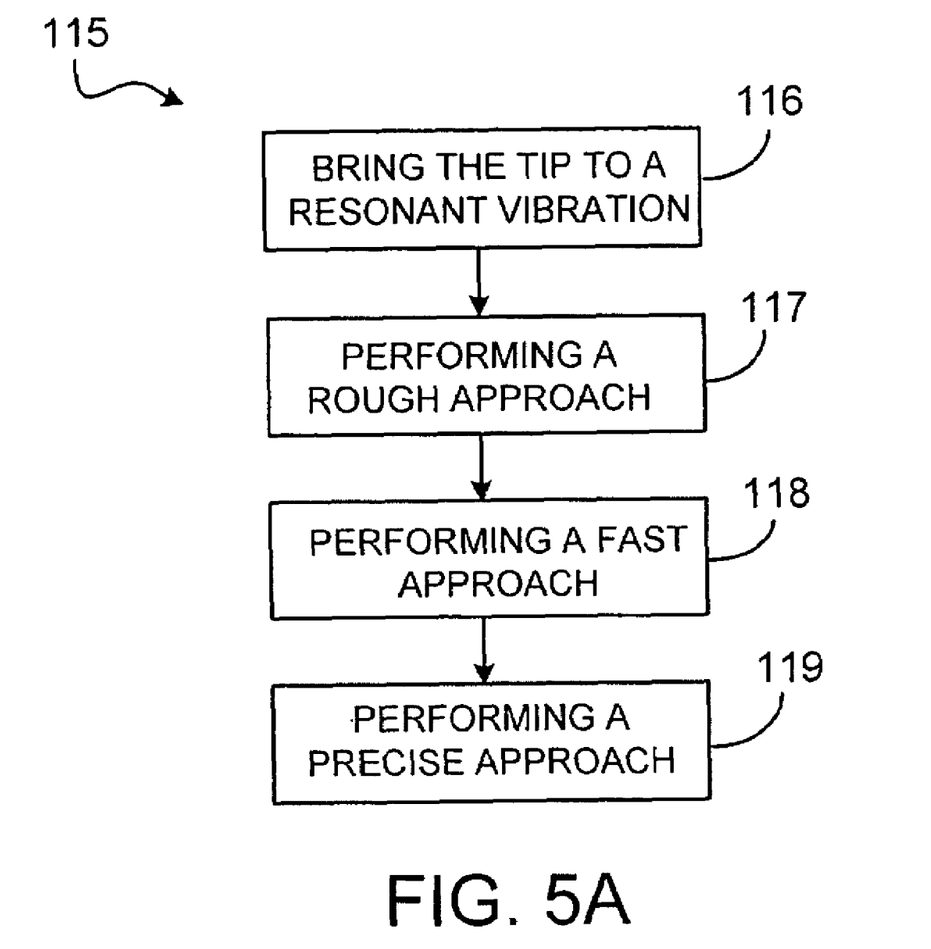
FIG. 5a is a flow diagram of the approach between the wafer and the tip of the Kelvin Force probe.

The approach is done after positioning of the tip 60 above the center of the prescribed area to be measured, for example, the test box 102 of product wafer 100 or the $V_{CPD}$ calibration plate. In reference to FIG. 5a the approach procedure 115 is shown. The tip is about 5 mm above the wafer and the cantilever is brought to a resonant vibration with a piezoelectric modulator 68. Performing a rough approach 116 is done by moving up the wafer on the chuck with the motorized z stage 18. The distance is monitored by the capacitive distance sensor 26 until the distance of the wafer tip reaches about 50 μm. Alternately, during the rough approach the distance can be monitored by measuring the cantilever vibration amplitude with a laser beam 72 and PSD 74. During the fast approach 118, the cantilever oscillation amplitude is monitored while the wafer moves up. The tip-surface distance is determined from precalibrated empirical relationship of oscillation amplitude and the distance. Fast approach stops with the tip at about 5 μm above the surface. In a precise approach 119 the wafer is moved up in 0.1 to 0.5 μm steps with amplitude readings between steps. The process continues until the desired distance of 1 μm is reached. In some embodiment, the distance is determined form the rate of the amplitude change with the wafer movement.

The precise vacuum gauge 48 in FIG. 1 monitors a vacuum holding the wafer 12 on the chuck 16. This monitoring is done for safety. Any sudden and unexpected vacuum failure would release the wafer 12 and possibly break the cantilever 62 and the tip 60. In case of vacuum failure, the pneumatic air cylinder 49 in FIG. 1 works as the fail-safe emergency release and rapidly moves up the Kelvin Force probe and corona assembly preventing damage to probe and possibly to the wafer.

Figure 5B:
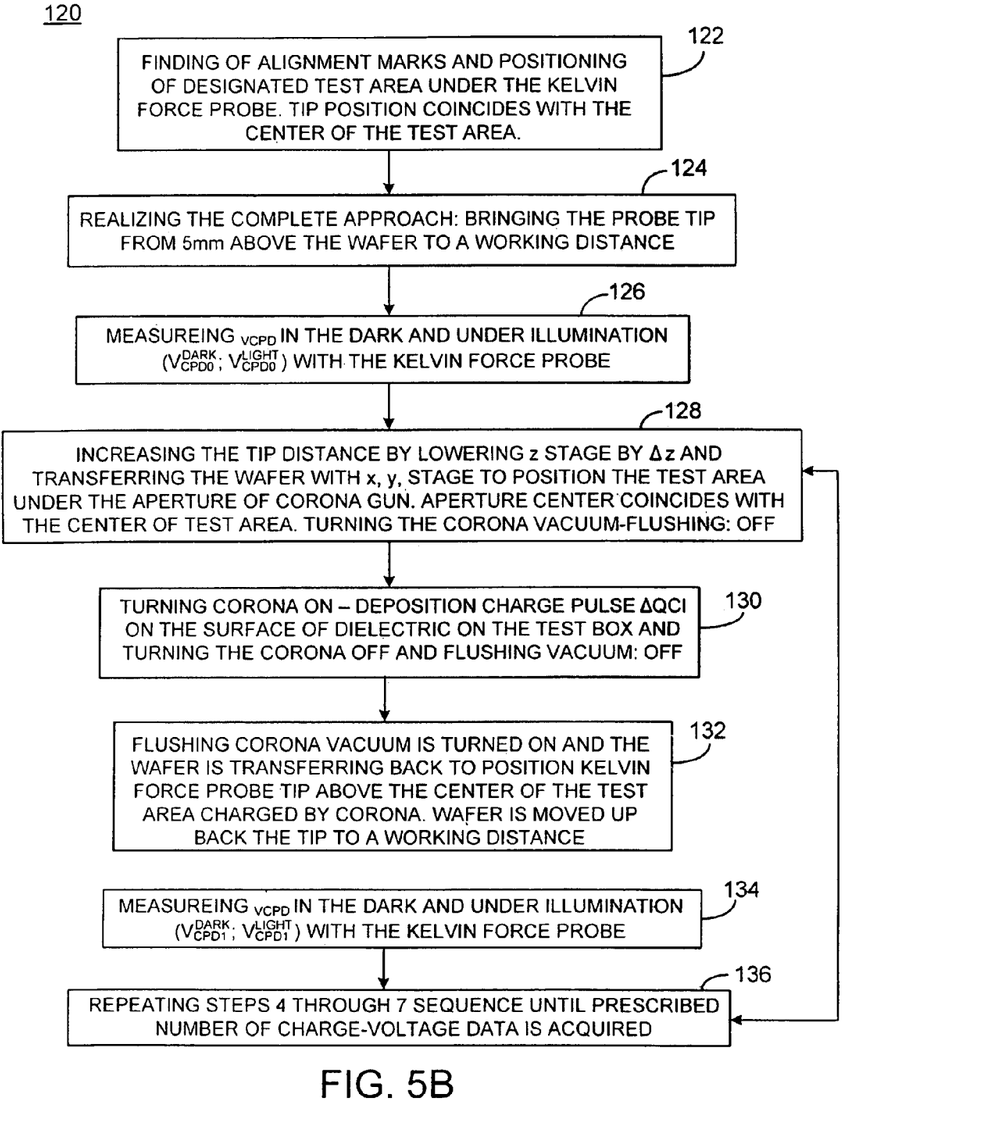
FIG. 5b is a flow diagram of a process for acquiring the charge-voltage data on a miniature test site of a semiconductor product wafer.

In reference to FIG. 5B, a process 120 for acquiring the charge-voltage data on a small test site of a semiconductor wafer is shown. The process 120 includes finding the alignment marks on the wafer (122). This is done with the machine vision system 36 in FIG. 1. Alignment marks reference the coordinates of the features on the wafer with respect to coordinates of the motorized motion stage 18 holding the wafer chuck 16 and the wafer 12.

By moving the stage 18, the wafer 12 is positioned such that the Kelvin Force probe tip 60 approximately aligns with the center of the test site preselected for measurement. After wafer loading during aligning the tip 60 is about 5 mm above the wafer surface (124). In some embodiments, the approach 115 is done bringing the tip 60 and the surface of wafer 12 to the working distance of 1 μm. The piezo-vibration is turned off. The cantilever vibration is stimulated by ac-voltage applied between the tip and the wafer from the first generator 64 in FIG. 2. The ac-force stimulating this vibration is then nulled off and the corresponding DC-bias gives the value of the contact potential difference between the probe and the semiconductor wafer. A measurement is performed in the dark and under strong LED illumination giving the initial voltages before corona charging $V_{CPD}^{DARK}$ and $V_{CPD}^{LIGHT}$ respectively (126).

The z-stage movement increases the surface-tip distance to a pre-set distance that can be e.g. 50 μm to enable safe horizontal translation of the wafer to position the center of the test area under the center of the aperture 94 of corona gun 24 (128). The corona vacuum flushing is turned off and the corona discharge is turned on (130).

A prescribed charge is placed on the surface with a density $\Delta Q_c$ that is essentially constant over an area substantially larger than an area of the Kelvin Force probe tip 60 (132). Corona discharge is done under conditions (i.e. high voltage value, discharge current, diaphragm bias, deposition time) set by the computer to obtain prescribed $\Delta Q_c$ using corona calibration data stored in the software. The corona discharge is terminated after $\Delta Q_c$ is deposited. The corona vacuum flushing is turned on. The charged area is brought back underneath the Kelvin Probe tip and the wafer is moved up to a working distance. The measurement of $V_{CPD}$ is performed in the dark and under illumination giving the voltage values after the first charging $V_{CPD}^{DARK}$ and $V_{CPD}^{LIGHT}$ respectively (134).

In measurements wherein more than one charge—voltage data is acquired the procedure continues by repeating steps (128, 130, 132, and 134) until the prescribed number of charge-voltage data is acquired 136.

The corona charging in this sequence uses the same charge dose $\Delta Q_{c1}$ for each charging or uses doses specially selected $\Delta Q_{ck}$, for any k-th step in the sequence. The charge-voltage is provided by full set of acquired voltages in the dark, under illumination and corresponding charge doses; for example:

$$V_{CPD0}^{DARK}, \quad V_{CPD1}^{DARK} \quad \ldots \quad V_{CPDK}^{DARK};$$
$$V_{CPD0}^{LIGHT}, \quad V_{CPD}^{LIGHT} \quad \ldots \quad V_{CPDK}^{LIGHT};$$
$$0, \quad \Delta Q_{c1} \quad \ldots, \quad \Delta Q_{ck}$$

It shall also be understood that the voltage after any charging step $V_{CPDK}$ may be a single voltage value or a set of voltages measured over a prescribed period of time t, interval, $\Delta t$, between each measurement. For example, a set of 1000 voltage values acquired at intervals of 0.01 s over a period of 10 seconds starting 1 second after termination of corona charging. Such set of voltage values represent the voltage transient (or the voltage time decay) after charging and can be registered in the dark or under illumination.

In some embodiments the measurement of voltage before corona charging 126 can be omitted when only voltages after charging are measured such as voltage transients for monitoring tunneling current, breakdown voltage or semiconductor doping.

In some other embodiments monitoring can be done on probing sites located not necessarily in the center of test area.

EXAMPLES

Figure 6A:
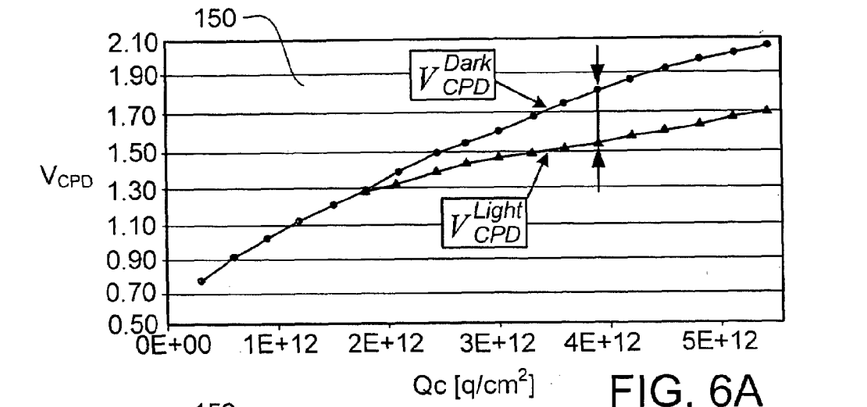
FIG. 6a show exemplary charge-voltage data acquired on a 70 µm×100 µm test site intended for monitoring the Al$_2$O$_3$ dielectric layer on p-type silicon wafer.

In reference to FIG. 6a, a plot 150 of 18 charge-voltage data points is shown. The charge-voltage data is acquired at probing site of 8 μm diameter at the center of a 60 μm×90 μm scribe line test box with $Al_2O_3$ film deposited on the top of p-type silicon wafer. In each of the corona charging steps, the same charge dose $\Delta Q_c$=3.0 E11 q/cm² was deposited. The data such as that in FIG. 6a can be used to calculate electrical surface parameters, e.g., the surface barrier $V_{SB}$, and the value $D_{it}$.

Figure 6B:
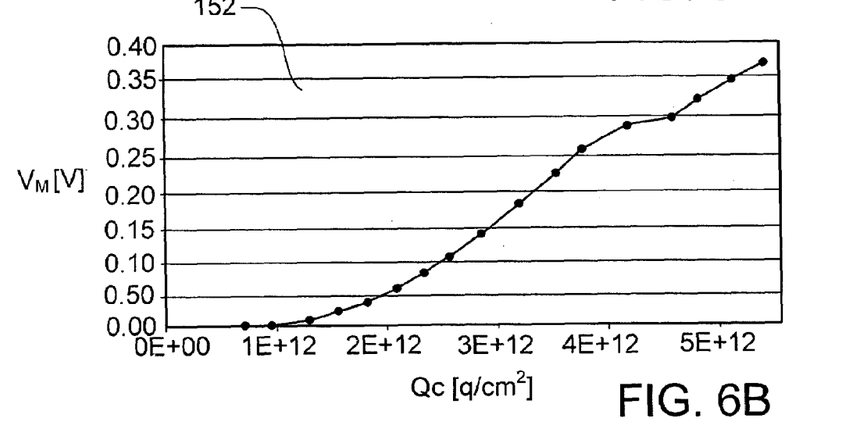
FIG. 6b presents the surface barrier $V_{SB}$ data calculated from data in FIG. 6a as $V_{SB} = V_{CPD}^{DARK} - V_{CPD}^{LIGHT}$

Referring to FIG. 6b, a plot 152 of $V_{SB}$ is shown. The values for $V_{SB}$ were derived using the charge-voltage data shown in FIG. 6a.

Figure 6C:
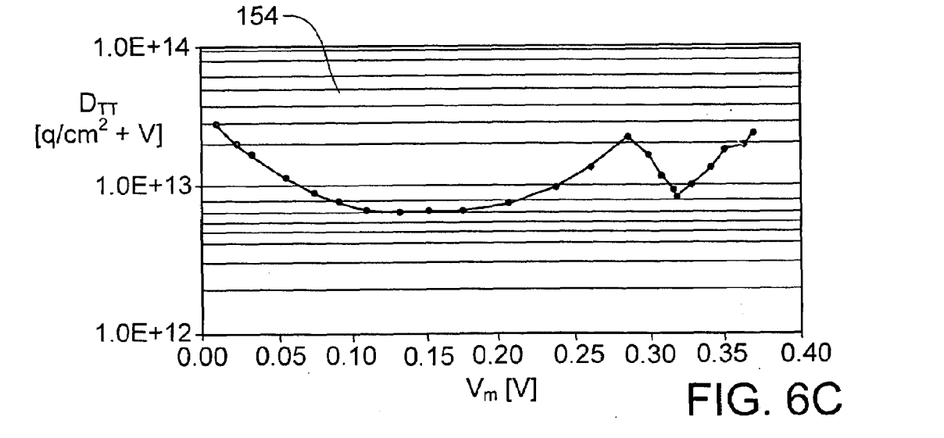
FIG. 6c presents density of interface traps $D_{it}$ spectrum determined from data in FIG. 6b according to procedure in patent U.S. Pat. No. 6,037,797

Referring to FIG. 6c, a plot 154 of $D_{it}$ is shown. The values for $D_{it}$ were derived using the charge-voltage data shown in FIG. 6a.

Procedures for deriving $V_{SB}$ and $D_{it}$ shown in FIGS. 6b–6c and other electrical parameters charge-voltage data are described in the patent U.S. Pat. No. 6,037,797. TABLE 1 lists parameters that were determined with the charge-voltage data acquired on the same 60 μm×90 μm test site used to measure the charge-voltage data shown in FIG. 6a.

TABLE 1

| | |
|---|---|
| CET [Å] | 14.2 |
| Dielectric Constant | 9.3 |
| Qc Charge Step [q/cm2] | 3.0E + 11 |
| Vfb [V] | 1.30 |
| Dit [q/cm2eV] | 7.2E + 12 |

Dielectric constant of $Al_2O_3$ film was obtained using the film capacitance in TABLE 1 and the film thickness provided by a supplier. Nominal thickness of $Al_2O_3$ was 34 Å.

A number of embodiments of the invention have been described. Nevertheless, it will be understood that various modifications may be made without departing from the spirit and scope of the invention. Accordingly, other embodiments are within the scope of the following claims.

What is claimed is:

1. A method for acquiring charge-voltage data on a miniature test site of a semiconductor wafer, the method comprising the following steps wherein each step is realized without contacting a surface of the semiconductor wafer:
   a) locating a test site on the surface of semiconductor wafer; the test site being no greater than approximately 10,000 μm²;
   b) positioning the test site under a voltage micro-probe and at a working distance to a tip of the micro-probe;
   c) measuring a surface voltage $V_{CPD0}$ of the test site;
   d) positioning the test site under a corona discharge device and depositing a dose of ionic charge $\Delta Q_{c1}$ on a surface of the test site;
   e) positioning the test site under the voltage micro-probe and at the working distance to the tip of the micro probe; and
   f) measuring a surface voltage $V_{CPD1}$ of the test site after charging.

2. The method of claim 1 wherein measuring the surface voltages comprises measuring each voltage in absence of illumination followed by measuring each voltage under illumination.

3. The method of claim 2 wherein measuring under illumination comprises illuminating the test site with light of photon energy larger than an energy gap of the semiconductor wafer and with intensity sufficient to substantially flatten a semiconductor surface barrier under depletion condition.

4. The method of claim 1 further comprising repeating steps a–f to acquire multiple charge-voltage data points.

5. The method of claim 4, wherein repeating steps a–f comprises performing steps a–f multiple times over a prescribed time interval.

6. The method of claim 1 further comprising calibrating the dose of ionic charge using a corona calibrating plate, a corona calibrating sample with known dielectric capacitance, or both.

7. The method of claim 1 wherein depositing with corona discharge a dose of ionic charge comprises selecting the dose to be in a range between approximately $1 \times 10^{10}$ q/cm² and $5\times10^{13}$ q/cm$^2$ and approximately constant over an area about three times larger than the area of the micro-probe tip.

8. The method of claim 6 further comprising providing a vacuum for flushing a corona gun after termination of each corona discharge and filling the gun with clean ambient to reduce contamination buildup within the gun and to reduce spreading the contaminants to the wafer surface.

9. The method of claim 1 wherein the voltage micro-probe is a Kelvin Force probe and measuring the surface voltage $V_{CPD1}$ comprises detecting a vibration of a cantilever using light sensed by a position sensitive detector PSD.

10. The method of claim 9, wherein the light has a photon energy that is smaller than a bandgap energy of the semiconductor wafer and the position sensitive detector has a spectral sensitivity range overlapping with the photon energy of the light.

11. The method of claim 10, wherein the light is emitted from a laser.

12. The method of claim 11 wherein the voltage measured before corona charging $V_{CPD0}$ and the voltage measured after corona charging $V_{CPD1}$ is measured in absence of illumination giving $V_{CPD0}^{DARK}$ and $V_{CPD1}^{DARK}$ respectively and under illumination suitable to substantially flatten a semiconductor surface barrier under depletion condition giving $V_{CPD0}^{LIGHT}$ and $V_{CPD1}^{LIGHT}$ respectively.

13. The method of claim 12, further comprising providing a tip having a flat end parallel to the wafer surface and another end attached to a cantilever wherein a diameter of the tip is substantially smaller than a diagonal of the test site and at least ten times larger than an average distance between ionic charges deposited on the test site.

14. The method of claim 13 further comprising reducing a contribution of voltage detected by the cantilever to the measured voltage by selecting a cantilever geometry and a tip geometry and a distance to the wafer from the tip that reduce a gradient of cantilever-wafer capacitance to less than approximately 3% of a gradient of tip-wafer capacitance.

15. The method of claim 14, further comprising:
    selecting a width of the cantilever to be approximately 30 µm;
    selecting a length of the cantilever to be approximately 90 µm;
    selecting a length of the tip to be approximately 15 µm; and
    selecting a diameter of the tip to be approximately 10 µm.

16. The method of claim 15, further comprising providing a working distance between the tip and the wafer surface of about 1 µm.

17. The method of claim 16, further comprising moving the cantilever and the tip away from the semiconductor wafer in response to detecting a failure selected from a group consisting of: a vacuum failure and a power supply failure.

18. The method of claim 1 wherein locating the test site on the semiconductor comprises using a machine vision system.

* * * * *